United States Patent
Wijekoon et al.

(10) Patent No.: US 6,572,453 B1
(45) Date of Patent: Jun. 3, 2003

(54) MULTI-FLUID POLISHING PROCESS

(75) Inventors: Kapila Wijekoon, Santa Clara; Stan D. Tsai, Fremont; Yuchun Wang, Cupertino; Doyle E. Bennett, Santa Clara; Fred C. Redeker, Fremont; Madhavi Chandrachood, Sunnyvale; Brian J. Brown, Palo Alto, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/575,218

(22) Filed: May 18, 2000

Related U.S. Application Data

(63) Continuation-in-part of application No. 09/359,141, filed on Jul. 21, 1999, which is a continuation-in-part of application No. 09/163,582, filed on Sep. 30, 1998.
(60) Provisional application No. 60/102,345, filed on Sep. 29, 1998.

(51) Int. Cl.⁷ .................................................. B24B 1/00
(52) U.S. Cl. ........................................ 451/56; 451/443
(58) Field of Search ........................ 451/56, 285, 287, 451/443, 444

(56) References Cited

U.S. PATENT DOCUMENTS

| | | | |
|---|---|---|---|
| 3,889,753 A | 6/1975 | Richardson | |
| 4,090,563 A | 5/1978 | Lybarger et al. | |
| 4,541,945 A | 9/1985 | Anderson et al. | |

(List continued on next page.)

FOREIGN PATENT DOCUMENTS

| | | |
|---|---|---|
| DE | 2154234 A | 5/1973 |
| DE | 3424329 A | 1/1986 |
| DE | 39 39 661 A1 | 6/1991 |
| EP | 0 401 147 | 12/1990 |
| EP | 0 496 605 | 7/1992 |
| EP | 0 860 860 | 8/1998 |
| FR | 2 722 511 | 7/1995 |
| JP | 87-160406 | 4/1988 |
| WO | WO 99/46353 | 9/1999 |

OTHER PUBLICATIONS

Bennett et al., "Multiple–Step Conditioning Process", Oct. 11, 2000, US 2001/0029155 A1, entire document.*
Pak, "Impact of EDTA on junction and photolith qualities", Extended Abstracts, Oct. 1980, vol. 80, No. 2, pp. 1241–1243.
Kern, "Radiochemical study of semiconductor surface contamination", RCA Review, Jun. 1970, vol. 31, pp. 207–264, see p. 249.
Kaufman et al., "Chemical–mechanical polishing for fabricating patterned W metal features as chip interconnects", Journal of the Electrochemical Society, vol. 138, No. 11, Nov. 1991, pp. 3460–3464.
Greer et al., "Process for removing wafer surface contaminants", IBM Technical Disclosure Bulletin, vol. 15, No. 8, Jan. 1973, p. 2358.
Patent Abstracts of Japan, vol. 16, No. 29 (C–904), Jan. 24, 1992 & JP 3242352, Oct. 29, 1991.
Hymes et al., "The Challenges of the Copper CMP Clean", Semiconductor International, pp. 117–122 (1998).
Zhao et al., "Copper CMP Cleaning Using Brush Scrubbing", 1998 CMP–MIC Conference, pp. 359–366 (1998).
Brusic et al., "Copper Corrosion With and Without Inhibitors", J. Electrochem, Soc., vol. 138, No. 8, Aug. 1991.

*Primary Examiner*—Joseph J. Hail, III
*Assistant Examiner*—David B. Thomas
(74) *Attorney, Agent, or Firm*—Dugan & Dugan

(57) ABSTRACT

A polishing method is provided which simultaneously supplies both a polishing fluid and a conditioning fluid to a polishing pad, while a substrate is in moving contact with the polishing pad.

20 Claims, 2 Drawing Sheets

U.S. PATENT DOCUMENTS

| | | | |
|---|---|---|---|
| 4,954,142 A | | 9/1990 | Carr et al. |
| 4,959,113 A | | 9/1990 | Roberts |
| 5,084,071 A | | 1/1992 | Nenandic et al. |
| 5,216,843 A | * | 6/1993 | Breivogel et al. ........... 451/285 |
| 5,225,034 A | | 7/1993 | Yu et al. |
| 5,340,370 A | | 8/1994 | Cadien et al. |
| 5,478,436 A | | 12/1995 | Winebarger et al. |
| 5,509,970 A | | 4/1996 | Shiramizu |
| 5,527,423 A | | 6/1996 | Neville et al. |
| 5,645,682 A | | 7/1997 | Skrovan |
| 5,662,769 A | | 9/1997 | Schonauer et al. |
| 5,664,990 A | * | 9/1997 | Adams et al. ............... 451/285 |
| 5,755,614 A | * | 5/1998 | Adams et al. ............... 134/902 |
| 5,830,280 A | | 11/1998 | Sato et al. |
| 5,840,629 A | * | 11/1998 | Carpio ........................ 216/105 |
| 5,876,508 A | | 3/1999 | Wu et al. |
| 5,879,226 A | | 3/1999 | Robinson |
| 5,916,010 A | * | 6/1999 | Varian et al. .................. 451/38 |
| 5,934,980 A | * | 8/1999 | Koos et al. .................... 451/41 |
| 5,957,757 A | * | 9/1999 | Berman ........................ 451/56 |
| 5,961,373 A | * | 10/1999 | Lai et al. ....................... 451/41 |
| 5,975,994 A | * | 11/1999 | Sandhu et al. ................. 451/56 |
| 5,981,454 A | | 11/1999 | Small |
| 6,022,266 A | * | 2/2000 | Bullard et al. ................. 451/56 |
| 6,030,487 A | * | 2/2000 | Fisher, Jr. et al. ........... 156/345 |
| 6,033,993 A | | 3/2000 | Love, Jr. et al. |
| 6,046,110 A | * | 4/2000 | Hirabayashi et al. ......... 216/88 |
| 6,060,396 A | * | 5/2000 | Fukami et al. ................. 216/89 |
| 6,083,840 A | | 7/2000 | Marvic et al. |
| 6,100,197 A | * | 8/2000 | Hasegawa ................... 438/629 |
| 6,162,301 A | | 12/2000 | Zhang et al. |
| 6,165,956 A | | 12/2000 | Zhang et al. |
| 6,179,693 B1 | * | 1/2001 | Beardsley et al. ............. 451/56 |
| 6,234,877 B1 | * | 5/2001 | Koos et al. .................... 451/41 |
| 6,263,605 B1 | * | 7/2001 | Vanell ........................ 451/41 |
| 6,352,595 B1 | | 3/2002 | Svirchevski et al. |
| 6,376,345 B1 | * | 4/2002 | Ohashi et al. ............... 438/542 |

\* cited by examiner

MULTI-FLUID POLISHING PROCESS

This application is a continuation-in-part of U.S. patent application Ser. No. 09/359,141, filed Jul. 21, 1999, titled "METHOD AND APPARATUS FOR CLEANING A POLISHING PAD," which is a continuation-in-part of U.S. patent application Ser. No. 09/163,582, filed Sep. 30, 1998, titled "IMPROVED COPPER CLEANING SOLUTION AND METHOD FOR USING SAME," which claims priority from U.S. Provisional Patent Application Serial No. 60/102,345, filed Sep. 29, 1998, titled "IMPROVED COPPER CLEANING SOLUTION AND METHOD FOR USING SAME."

FIELD OF THE INVENTION

The present invention relates to the field of semiconductor processing, and more particularly to a method and apparatus for polishing and/or planarizing semiconductor wafers and the thin films formed thereon.

BACKGROUND OF THE INVENTION

Semiconductor devices are formed on silicon substrates and are typically multi-layered, having numerous metalization layers separated by numerous insulating oxides and interconnected with vias or contact holes. For instance, an interconnect for a typical multi-layer device is formed by depositing and patterning a first metal layer over the device, depositing an intermediate oxide over the patterned first metal layer, photolithographically defining a contact hole in the oxide, and depositing a second metal layer over the oxide that fills the contact hole and contacts the patterned first metal layer.

Often undesirable steps or undulations must be removed from the silicon substrate or from one of the metal or oxide layers before another layer can be formed thereon. To remove steps or undulations, the silicon oxide or metal is preferably planarized, removing any steps or undulations formed therein, prior to deposition of a layer thereon. Planarization is typically performed mechanically by forcing the semiconductor wafer face down against a polishing pad which is saturated with a polishing fluid (e.g., a slurry or polishing chemical) and by moving the polishing pad relative to the wafer. The relative movement between the polishing pad and the wafer mechanically removes layers of material and is continued until the steps or undulations are removed. This process is generally referred to as chemical mechanical polishing (CMP).

To facilitate material removal during the CMP process the polishing pad may be provided with grooves that channel polishing fluid to the polishing pad/wafer interface, and that provide a path for wafer material to be removed from the polished wafer surface, and/or the pad may be made porous to hold the slurry chemical and polishing by-product.

During polishing, however, the downward force of the wafer against the polishing pad compacts polishing fluid particles and polishing by products within these grooves and porous structures, reducing the supply of fresh polishing fluid or polishing chemical to the polishing pad/wafer interface, reducing friction between the wafer and the pad, reducing the removal rate of wafer material, and the overall polishing efficiency, uniformity and throughput of the CMP process, as well as giving rise to defects in the form of wafer scratches, as described below, and increasing dishing of the wafer surface. Additionally, the downward force of the wafer against the polishing pad causes the semi-porous surface of the polishing pad to pack down, causing polishing rates to become low and unpredictable, and necessitating frequent polishing pad replacement.

To extend the useful life of a polishing pad, a pad conditioner that roughens or "conditions" the polishing pad surface is employed in-situ, while the polishing pad polishes a wafer and while a polishing chemical/slurry is supplied to the pad surface; or ex-situ, after wafer polishing is complete, and while deionized water is supplied to the pad surface. A typical pad conditioner comprises a diamond surface that roughens the polishing pad surface by scribing additional "microgrooves" in the polishing pad surface. Roughening of the polishing pad surface ensures adequate abrasion (e.g., due to polishing fluid saturation of the roughened surface) at the polishing pad/wafer interface. In certain applications however, unstable polishing rates none-the-less persist. Accordingly, an improved polisher method and apparatus is needed.

SUMMARY OF THE INVENTION

The present inventors have discovered that polishing of wafers having certain material layers (e.g., copper layers) deposited thereon results in the build up of materials on the polishing pad. Such build up is not removable via conventional conditioning methods. Accordingly the present invention provides a method and apparatus that avoids the build up of polishing by products from the polishing pad without the reduction in throughput associated with conventional ex-situ conditioning. Conventional ex-sit conditioning tends to reduce system throughput as additional time is required for moving the wafer into and out of contact with the polishing pad. Specifically, a polishing method is provided which simultaneously supplies both a polishing fluid and a conditioning fluid to a polishing pad, while a substrate is in moving contact with the polishing pad.

Other features and advantages of the present invention will become more fully apparent from the following detailed description of the preferred embodiments, the appended claims and the accompanying drawings.

DETAILED DESCRIPTION OF THE PREFERRED EMBODIMENTS

Figure 1:
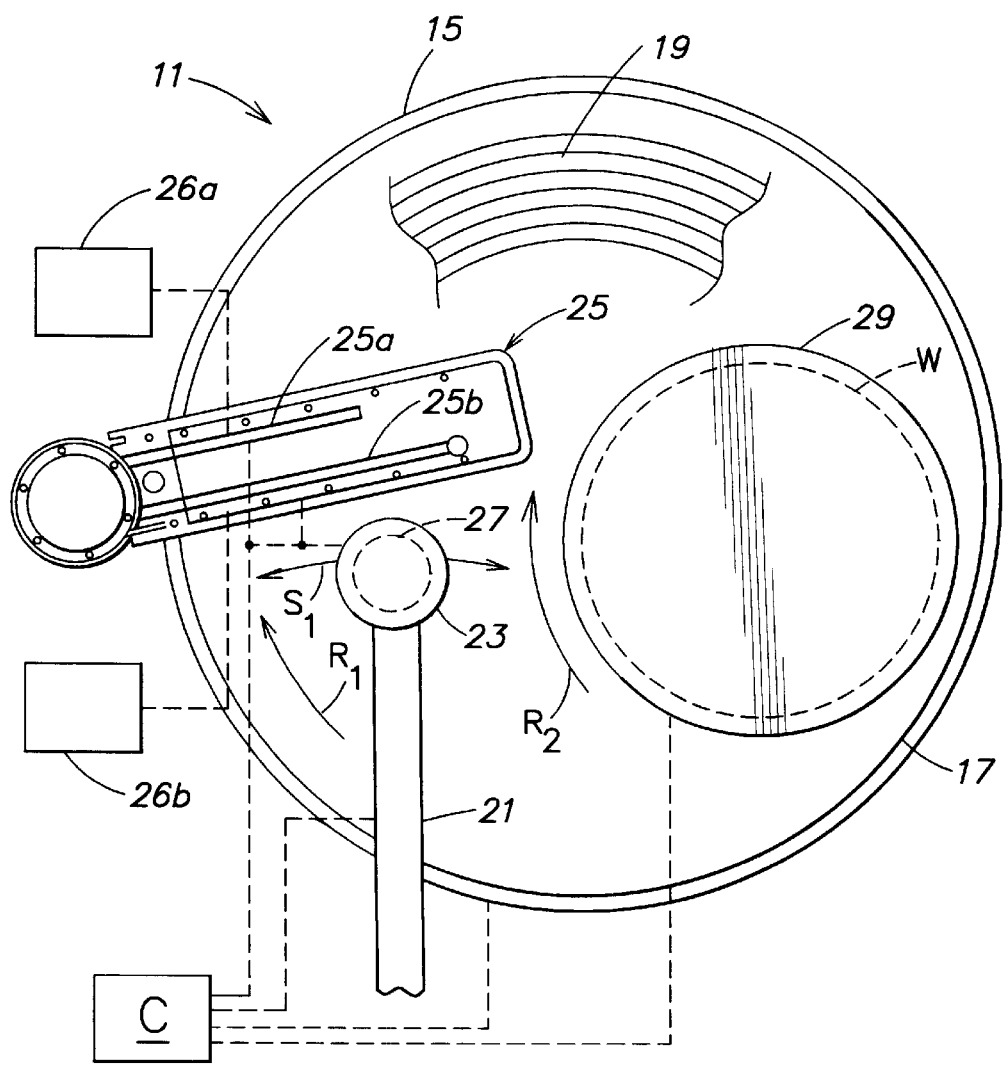
FIG. 1 is a schematic top plan view of a preferred embodiment of an inventive chemical mechanical polishing device which has a controller C programmed to perform the inventive polishing process.

FIG. 1 is a schematic top plan view of a preferred embodiment of an inventive chemical mechanical polishing device 11 which has a controller C programmed to perform the inventive polishing process as further described below. Although merely exemplary, the polishing device 11 comprises a platen 15 on which a polishing pad 17 for polishing semiconductor wafers is mounted. In this embodiment the platen 15 preferably is rotatable and the polishing pad 17 has at least one groove 19 and typically has a plurality of concentric circumferential grooves 19.

The polishing device 11 also comprises a pivot arm 21, a holder or conditioning head 23 mounted to one end of the pivot arm 21, a fluid arm 25 having a slurry/chemical polishing fluid supply line 25a for supplying polishing fluid to the polishing pad 17 from a polishing fluid source 26a, a conditioning chemical fluid supply line 25b for supplying a conditioning fluid (e.g., Applied Materials' ElectraClean™ (disclosed in U.S. patent application Ser. No. 09/359,141 filed Jul. 21, 1999 and U.S. patent application Ser. No. 09/163,582 filed Sep. 30, 1998), solutions capable of removing CuOx (particularly $Cu_1,Ox$) by products, solutions capable of removing copper compounds, or solutions containing carboxylic salts, ammonium compounds, etc.), to the polishing pad 17 from a conditioning fluid source 26b, a pad conditioner 27, such as a disk embedded with diamond crystals, mounted to the underside of the conditioning head 23, and a wafer mounting head 29 operatively coupled to the platen 15 so as to selectively press a wafer W against the polishing pad 17. A controller C is coupled to the mechanisms which actuate the platen 15, the pivot arm 21, the conditioning head 23, the polishing fluid supply line 25a, and the conditioning fluid supply line 25b and is programmed to perform the inventive polishing process described below.

In operation, a wafer W having a material layer (e.g., a copper layer) deposited thereon, which conventionally results in the build up of material that is not removable via conventional conditioning methods (for example, methods that employ deionized water and/or a polishing chemical) is placed on the polishing pad 17, and is held face down against the polishing pad 17 by the wafer mounting head 29 with a pressure for example of 1–7 psi, preferably 3 psi. Conditioning fluid (e.g., ElectraClean™ marketed by Applied Materials, Inc.) and a polishing chemical (e.g., Klebosol 1501, marketed by Rodel, Inc., EPC-C5001™ marketed by Cabot, Inc. diluted with 2.5% wt/vol Hydrogen Peroxide or with another oxidizing agent) is introduced to the polishing pad 17 via the conditioning fluid supply line 25b, and via the polishing chemical supply line 25a, at a flow rate of 200 ml/min and 50 ml/min, respectively (a polishing chemical/conditioning fluid ratio of 4:1, vol/vol). It will be understood that the conditioning fluid may be bought in concentrated form and then diluted before application to the polishing pad. For example, when the conditioning fluid is Electra-Clean™ the 1 part conditioning fluid applied to the polishing pad may comprise 91.0–91.6% deionized water, 7.8–8.4% tribasic ammonium citrate, 0.6% ammonium hydroxide (each concentrations being in wt % (wt/wt)).

Alternatively, the conditioning fluid and polishing chemical may be introduced via a single line, either from a single source, or from individual sources, and may or may not be premixed. The conditioning fluid and/or polishing chemical optionally may be pressurized (e.g., by applying 0–15 psi to the pump which supplies the fluid/chemistry to the pad). The platen 15 rotates as indicated by the arrow $R_1$. Throughout the above described process, the conditioning arm 21 preferably scans back and forth across the polishing pad 17, aiding the distribution of the polishing and conditioning fluids. The preferred platen speed is in the range of 10–200 rpm, and most preferably is 93 rpm. As the polishing chemical aids the removal of material from the surface of the wafer W, the conditioning fluid, cleans, etches and/or otherwise prevents removed material and other polishing by products from building up on the polishing pad 17. Accordingly, a stable polishing rate is maintained throughout the polishing process. Wafer throughput may also be maximized, as there is no need for a separate ex-situ conditioning step.

Figure 2:
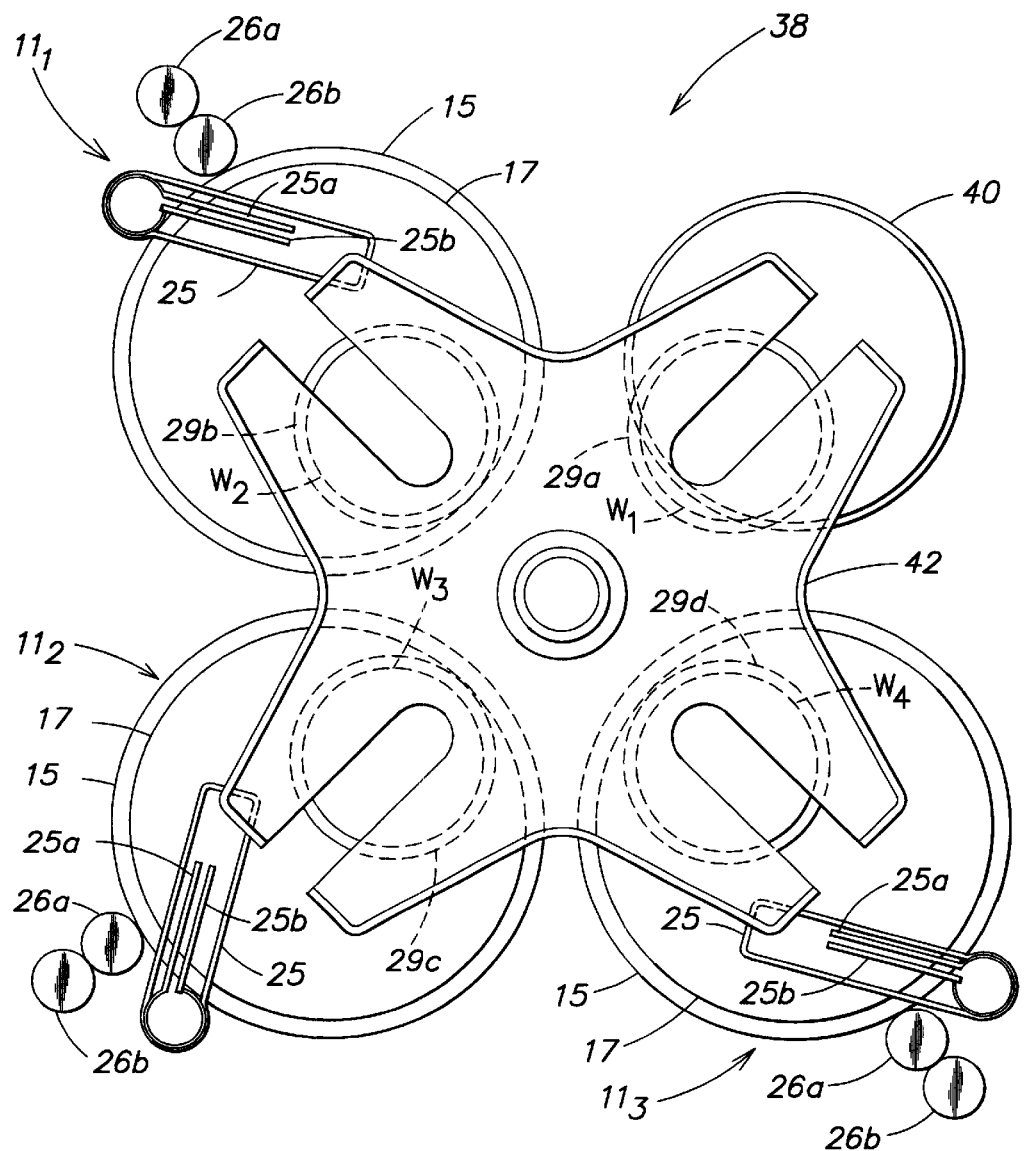
FIG. 2 is a top plan view of a system for polishing substrates in accordance with the invention.

FIG. 2 is a top plan view of a system 38 for polishing substrates. The system 38 comprises a plurality of polishing apparatuses $11_1$–$11_3$ each of which is preferably programmed to perform the inventive conditioning method described above. Among the polishing apparatuses $11_1$–$11_3$ like reference numerals are used to identify corresponding components.

The system 38 also includes a load cup 40, and a rotatable cross bar 42 to which a plurality of wafer mounting heads 29a–d are coupled. Thus, a wafer W may be loaded onto the load cup 40 and loaded or mounted therefrom to the first wafer mounting head 29a while wafer mounting heads 29b–d press wafers against the polishing pads of the various polishing apparatuses $11_1$–$11_3$.

In operation a first wafer $W_1$ is loaded (e.g., via a wafer handler that is not shown) onto the load cup 40 and mounted therefrom to the first wafer mounting head 29a. The rotatable cross bar 42 is indexed carrying the first wafer $W_1$ to the first polishing apparatus $11_1$ where the first wafer $W_1$ is polished as previously described, while a second wafer $W_2$ is loaded onto the load cup 40 and mounted therefrom to the second wafer mounting head 29b. The rotatable cross bar 42 is indexed again; the wafer $W_1$ is polished by the second polishing apparatus $11_2$ (e.g., via a different polishing fluid than that used by the first polishing apparatus $11_1$); the second wafer $W_2$ is polished by the first polishing apparatus $11_1$ and a third wafer $W_3$ is loaded into the load cup 40 and mounted to the third wafer mounting head 29c.

Thereafter, the rotatable cross bar 40 indexes and the first wafer $W_1$ is carried to and polished by the third polishing apparatus $11_3$. Meanwhile the second wafer $W_2$ is polished by the second polishing apparatus $11_2$; the third wafer $W_3$ is polished by the first polishing apparatus $11_1$, and a fourth wafer $W_4$ is loaded onto the load cup 40 and mounted to a fourth wafer mounting head 29d.

The rotatable cross bar 42 then indexes carrying the first wafer $W_1$ to the load cup 40 (as shown in FIG. 6) where the first wafer mounting head 29a places the first wafer $W_1$ on the load cup 40 and a wafer handler (not shown) extracts the first wafer $W_1$ from the system 38. The inventive polishing/conditioning process described above with reference to FIG. 1 may be performed by any number of the polishing apparatuses of the system 38 and is preferably performed by each of the polishing apparatuses $11_1$–$11_3$ in order to maximize any throughput increases the inventive polishing/conditioning process provides.

The foregoing description discloses only the preferred embodiments of the invention, modifications of the above disclosed apparatus and method which fall within the scope of the invention will be readily apparent to those of ordinary skill in the art. For instance, although the invention is described with reference to a horizontally oriented, rotational-polishing device, the invention advantageously may be employed with any polishing device including vertically oriented polishers and/or polishers which employ translating polishing pads or conveyor-type polishing bands such as that described in U.S. Pat. No. 5,692,947. Preferably the cleaning fluid comprises citric acid and ammonium hydroxide. The specific composition of a suitable conditioning fluid is disclosed in U.S. patent application Ser. No. 09/359,141 (filed Jul. 21, 1999) and U.S. patent application Ser. No. 09/163,582 (filed Sep. 30, 1998). The entire disclosures of both applications are incorporated herein by this reference.

The invention may be employed with any type of polishing pad, hard polishing pads (e.g., cast polyurethane) soft, porous polishing pads (e.g., PVA or soft polyurethane) either of which may or may not have grooves formed or scribed therein. The grooves may form any pattern including an x-y grid, such as the grooves found in the fixed abrasive pads manufactured by the Minnesota Mining and Manufacturing Company and described for example in U.S. Pat. No. 5,378,251.

Accordingly, while the present invention has been disclosed in connection with the preferred embodiments thereof, it should be understood that other embodiments may fall within the spirit and scope of the invention, as defined by the following claims.

The invention claimed is:

1. A method of polishing a substrate comprising:

placing a substrate, having a material to be polished, in contact with a polishing pad;

generating relative movement between the substrate and the polishing pad, while the substrate and polishing pad are in contact, and supplying a polishing chemical and a conditioning fluid to the polishing pad while the polishing pad and substrate are in moving contact, wherein the conditioning fluid etches polishing by products comprising the material.

2. The method of claim 1 further comprising conditioning the polishing pad with an abrasive conditioning surface while supplying the polishing chemical and the conditioning fluid to the polishing pad.

3. The method of claim 1 wherein the material to be polished is one that, absent the conditioning fluid, would build up on the polishing pad, and wherein the conditioning fluid is one that prevents such build up.

4. The method of claim 3 further comprising conditioning the polishing pad with an abrasive conditioning surface while supplying the polishing chemical and the conditioning fluid to the polishing pad.

5. The method of claim 3 wherein the conditioning fluid is diluted with deionized water.

6. The method of claim 5 further comprising conditioning the polishing pad with an abrasive conditioning surface while supplying the polishing chemical and the conditioning fluid to the polishing pad.

7. The method of claim 1 wherein the material to be polished is copper.

8. The method of claim 7 further comprising conditioning the polishing pad with an abrasive conditioning surface while supplying the polishing chemical and the conditioning fluid to the polishing pad.

9. The method of claim 7 wherein the conditioning fluid comprises citric acid and ammonium hydroxide.

10. The method of claim 9 further comprising conditioning the polishing pad with an abrasive conditioning surface while supplying the polishing chemical and the conditioning fluid to the polishing pad.

11. The method of claim 1 wherein the polishing chemical is diluted with an oxidizing agent.

12. The method of claim 7 wherein the polishing by products comprise copper oxide.

13. The method of claim 9 wherein the polishing by products comprise copper oxide.

14. The method of claim 1 wherein the polishing by products comprise copper compounds.

15. The method of claim 1 wherein the conditioning fluid comprises a carboxylic salt.

16. The method of claim 1 wherein the conditioning fluid comprises an ammonium compound.

17. The method of claim 2 wherein the conditioning fluid comprises a carboxylic salt.

18. The method of claim 2 wherein the conditioning fluid comprises an ammonium compound.

19. The method of claim 1 wherein the conditioning fluid comprises citric acid and ammonium hydroxide.

20. The method of claim 2 wherein the conditioning fluid comprises citric acid and ammonium hydroxide.

* * * * *